United States Patent
Chen et al.

(10) Patent No.: US 8,418,030 B2
(45) Date of Patent: Apr. 9, 2013

(54) STORAGE SYSTEM WITH DATA RECOVERY FUNCTION AND METHOD THEREOF

(75) Inventors: Ming-Dar Chen, Hsinchu (TW); Chuan-Sheng Lin, Hsinchu County (TW); Hsiang-An Hsieh, Taipei County (TW); Hui-Neng Chang, Taoyuan County (TW)

(73) Assignee: A-Data Technology Co., Ltd., Taipei (TW)

( * ) Notice: Subject to any disclaimer, the term of this patent is extended or adjusted under 35 U.S.C. 154(b) by 938 days.

(21) Appl. No.: 12/243,472

(22) Filed: Oct. 1, 2008

(65) Prior Publication Data

US 2009/0282305 A1    Nov. 12, 2009

(30) Foreign Application Priority Data

May 9, 2008 (TW) ................................ 97117157 A (51) Int. Cl.
*G11C 29/00* (2006.01)
(52) U.S. Cl.
USPC ........... 714/764; 714/718; 714/766; 714/768; 714/773; 365/200; 365/201
(58) Field of Classification Search .................. 714/718, 714/764, 766, 768, 773; 365/200, 201
See application file for complete search history.

(56) References Cited

U.S. PATENT DOCUMENTS

| | | | | | |
|---|---|---|---|---|---|
| 4,139,148 | A | * | 2/1979 | Scheuneman et al. | 714/753 |
| 4,319,357 | A | * | 3/1982 | Bossen | 714/753 |
| 4,342,084 | A | * | 7/1982 | Sager et al. | 714/42 |
| 4,458,349 | A | * | 7/1984 | Aichelmann et al. | 714/6.24 |
| 4,485,471 | A | * | 11/1984 | Singh et al. | 714/702 |
| 5,511,164 | A | * | 4/1996 | Brunmeier et al. | 714/53 |
| 5,920,579 | A | * | 7/1999 | Nagai et al. | 714/764 |
| 6,014,766 | A | * | 1/2000 | Nagai et al. | 714/764 |
| 6,035,436 | A | * | 3/2000 | Wu et al. | 714/797 |
| 6,236,602 | B1 | * | 5/2001 | Patti | 365/201 |
| 6,469,945 | B2 | * | 10/2002 | Patti et al. | 365/201 |
| 6,785,856 | B1 | | 8/2004 | Parker et al. | |
| 7,020,811 | B2 | * | 3/2006 | Byrd | 714/703 |
| 7,053,470 | B1 | * | 5/2006 | Sellers et al. | 257/678 |
| 7,162,660 | B2 | * | 1/2007 | Ogino | 714/6.13 |

(Continued)

FOREIGN PATENT DOCUMENTS

| | | | |
|---|---|---|---|
| EP | 80354 A2 | * | 6/1983 |
| EP | 2256634 A1 | * | 12/2010 |
| JP | 359148954 A | * | 8/1984 |
| JP | 02287743 A | * | 11/1990 |

*Primary Examiner* — John J Tabone, Jr.

(74) *Attorney, Agent, or Firm* — Rosenberg, Klein & Lee (57) ABSTRACT

A storage system with a data recovery function and its method reduce errors in a storage medium to a recoverable range of a general ECC function by repeating a testing and recovery procedure for one or more times to assure the accuracy of reading data and enhance the data reliability effectively. The data recovery procedure includes the steps of providing test data by a test data generator of the storage system, writing the test data into a memory block where error data is found, finding an error bit by reading the test data, reducing the error to a recoverable range of the ECC technique by the recovery procedure. If the error bit cannot be found or reduced to a recoverable range of the ECC technique within an upper limit of the number of tests, the memory block is marked as bad.

10 Claims, 11 Drawing Sheets

U.S. PATENT DOCUMENTS

| | | | |
|---|---|---|---|
| 7,249,296 B2* | 7/2007 | Hirabayashi | 714/718 |
| 7,286,416 B2* | 10/2007 | Ooishi et al. | 365/189.05 |
| 7,398,439 B2* | 7/2008 | Kushida et al. | 714/718 |
| 7,441,166 B2* | 10/2008 | Yamada et al. | 714/718 |
| 7,447,955 B2* | 11/2008 | Niijima et al. | 714/718 |
| 7,779,334 B2* | 8/2010 | Earle et al. | 714/763 |
| 7,945,826 B2* | 5/2011 | Kameda et al. | 714/723 |
| 7,954,028 B2* | 5/2011 | Barth et al. | 714/733 |
| 7,996,734 B2* | 8/2011 | Earle et al. | 714/718 |
| 8,001,447 B2* | 8/2011 | Katoh et al. | 714/781 |
| 2004/0230879 A1 | 11/2004 | Crosby | |
| 2006/0218432 A1* | 9/2006 | Traskov et al. | 714/5 |
| 2009/0172496 A1* | 7/2009 | Roine | 714/758 |
| 2011/0258515 A1* | 10/2011 | Earle et al. | 714/763 |

* cited by examiner

STORAGE SYSTEM WITH DATA RECOVERY FUNCTION AND METHOD THEREOF

BACKGROUND OF THE INVENTION

1. Field of the Invention

The present invention relates to a storage system with a data recovery function and its method, and more particularly to a system and a method for testing a memory and correcting data by writing test data into an address of error data for one or more times.

2. Description of Related Art

As flash memories offer faster access speed, less power consumption, smaller volume and better shock resistance than traditional hard disks, flash memories are used extensively in information storage devices.

Due to the structure of the flash memory, stored data may have errors caused by the interference of high voltage and the deterioration or damage of a memory cell. For instance, the original state of a memory cell is of high potential, but the controller reads a low potential of the memory cell, or the original state of a memory cell is of low potential, but the controller reads a high potential of the memory cell.

To prevent errors of the data stored in the flash memory and enhance the reliability of the stored data, the prior art uses an error checking and correction (ECC) technique for detecting and correcting error data.

The ECC technique is described briefly as follows. When data is written into a flash memory, the data is computed by an ECC unit of a memory controller to generate an ECC code of the data, and the ECC code together with the data are stored in the flash memory. When the data is read, the controller reads the data and the ECC code, and the ECC unit executes the operation of checking and correcting an error bit. If no error bit is found in the checking operation, then the data will be outputted. If an error bit is found in the checking operation and the number of error bits falls within a range recoverable by the ECC technique, then the data will be outputted after a correction is made. If the number of detected error bits exceeds the range recoverable by the ECC technique, then the controller will report an error of reading data.

Related checking and correction methods for the data stored in a flash memory are disclosed in U.S. Pat. Publication No. 20040230879 entitled "Apparatus and method for responding to data retention loss in a non-volatile memory unit using error checking and correction techniques" and issued on Nov. 18, 2004, and U.S. Pat. No. 6,785,856 entitled "Internal self-test circuit for a memory array", issued on Aug. 31, 2004. The former issued patent provides an error detection and recovery method for error bits of a flash memory recoverable by the ECC technique, and the later issued patent provides a test circuit installed in a storage system for detecting error bits in a memory as shown in FIG. 1.

Figure 1:
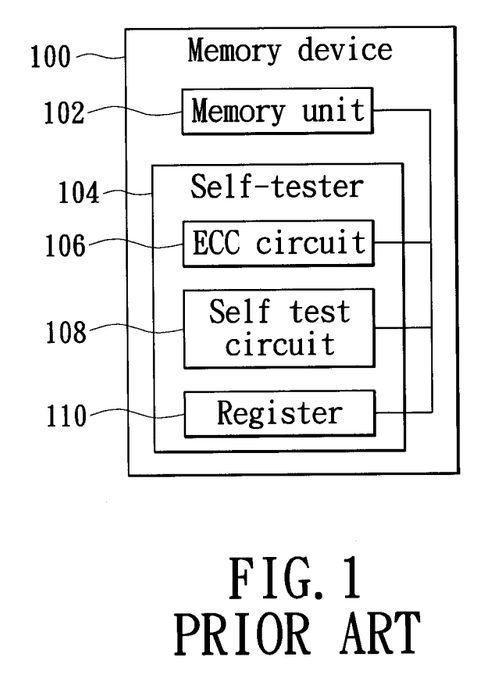
FIG. 1 is a circuit block diagram of a conventional memory device having a self recovery capability.

With reference to FIG. 1 for a memory device 100 having a self-tester 104 disclosed in U.S. Pat. No. 6,785,856, a memory unit 102 is connected to the self-tester 104 comprising an error checking and correction (ECC) circuit 106, a self test circuit 108, and a register 110. The memory unit 102 comes with a memory structure divided into several memory pages. The self-tester 104 is responsible for detecting and correcting an error in the memory. The ECC circuit 106 is provided for checking each memory page by groups, and a cyclic redundancy check (CRC) method of the Reed-Solomon algorithm is used for detecting the errors in the memory unit, and the self test circuit 108 is provided for counting the number of errors in the memory and storing the number of errors in a buffer area 110, and different data tests for an access state of each memory bit are used for the data correction.

In the aforementioned prior art, the error of reading data still occurs if the number of error bits exceeds the range recoverable by the ECC technique.

SUMMARY OF THE INVENTION

In view of the foregoing shortcomings of the prior art, the present invention provides an error checking and correction (ECC) technique to overcome the limitation of the conventional data checking and correction of a storage medium.

Therefore, it is a primary objective of the present invention to provide a data correction technique applied to a storage medium for correcting errors in the storage medium through one or more test procedures, and reducing the error bits to a range recoverable by the ECC technique. If the number of tests for the next time exceeds an upper limit, then the error memory block is marked as bad to enhance the data reliability of the storage medium.

The storage system with a data recovery function in accordance with the present invention comprises a control unit and a memory unit, wherein the control unit includes a test data generator, a comparison unit, a recovery unit, a data register and an ECC unit.

The test data generator is provided for generating test data. The comparison unit is provided for comparing test data provided by the test data generator and read from a memory unit to determine whether or not such storage space hag an error bit. The data register is provided for buffering error data that is stored in the memory unit and cannot be recovered by the ECC technique. The recovery unit corrects bit data corresponding to an error bit in the data register according to the information of the error bit provided by the comparison unit. In addition to the execution of checking and correcting data during a general read/write operation, the ECC unit is provided for executing the checking and correction operation of error data in the data register.

In the aforementioned preferred embodiment of a data recovery method of a storage system, if an error not recoverable by the ECC technique occurs in one or more memory pages of a first memory block of a memory unit, then the data in the first memory block is duplicated to a second memory block and then the data in the first memory block is erased. A test data generator of the control unit provides a record of test data to be written into the first memory block where the error data occurs and checks whether or not two records of data are the same by reading the data from the memory page having error data occurred in the first memory block.

If no error bit is found, the method of the present invention continues the test procedure for the next time, so that the test data generator generates another set of test data to execute a second-time test procedure for detecting an error bit on a memory page of the first memory block where the error data occurs. If no error bit is found after the test procedure has been executed repeatedly for a plurality of times that exceeds an upper limit, then the first memory block will be marked as bad. If an error bit is found at the first time or several times after the test procedure, then the data corresponding to the error bits in the data register are corrected to a range recoverable by the ECC technique. If the ECC technique still cannot recover the data, then the test procedure will be performed for another time to correct the error data in the data register and attempt to reduce the number of error bits to a range recoverable by the ECC technique.

DETAILED DESCRIPTION OF PREFERRED EMBODIMENTS

The present invention provides a storage system with a data recovery function and a method thereof, and more specifically a system and a method capable of checking and recovering an error bit of stored data that cannot be recovered by an error checking and correction (ECC) technique to assure the accuracy of reading data and improving the data reliability effectively.

To assure the data reliability, the prior art adopts error data checking and recovery method with an ECC function for a control unit to read data from a memory, but the ECC error recovery capability is very limited. If the number of error bits of the data exceeds the range recoverable by the ECC technique, then the error of reading data still occurs. The error data in a storage system not recoverable by the ECC technique can be detected by writing test data into an address where the error data is stored and then an error bit of the data is corrected. The number of error bits in the data is reduced to a range recoverable by the ECC technique, so that if error data cannot be recovered by the ECC technique, the recovery method of the present invention can be used for correcting the error data and reading a corrected data.

Figure 2:
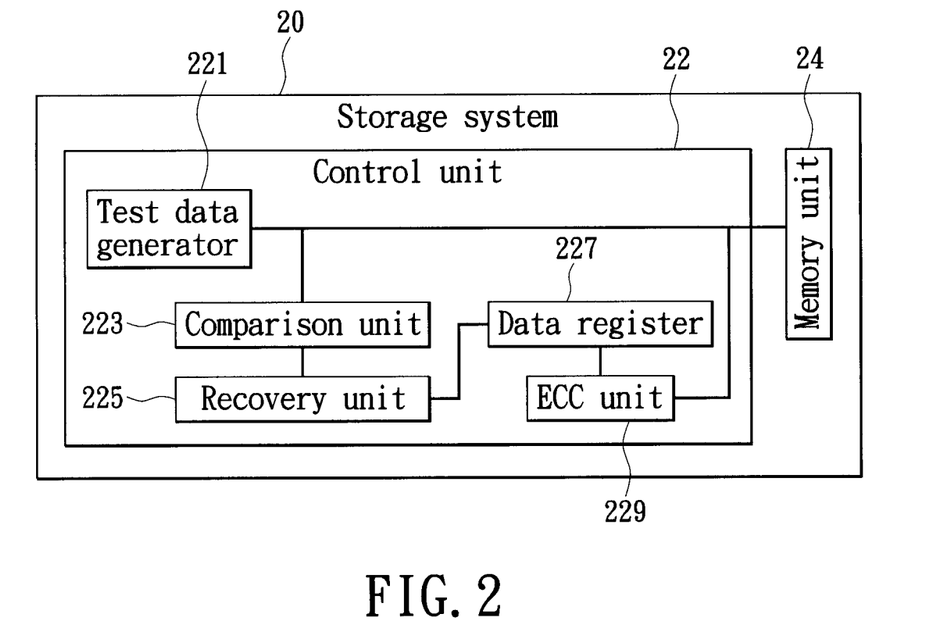
FIG. 2 is a functional block diagram of a storage system in accordance with the present invention.

With reference to FIG. 2 for a functional block diagram of a storage system in accordance with the present invention, the storage system 20 comprises a control unit 22 and a memory unit (which is a non-volatile memory) 24 electrically coupled with each other, wherein the control unit 22 comprises a test data generator 221, a comparison unit 223, a recovery unit 225, a data register 227 and an error checking and correction (ECC) unit 229.

The test data generator 221 is provided for generating test data, and writing the test data into a memory unit, and the test data can be data with all bits equal to "0" such as 0x00, data with all bits equal to "1" such as 0xFF, or data with a value having "0" and "1" such as 0x55 or 0xAA, or the test data can be binary random number data. The comparison unit 223 is provided for comparing test data written into a memory unit 24 (which is a non-volatile memory such as a flash memory in this embodiment) by the control unit 22 with data read from the memory unit 24 to determine whether or not an error bit exists in the memory unit 24 and also determine the information such as the address of an error bit in the memory unit.

For example, if the test data written into the memory unit 24 is data with all bits equal to "0" and the data read from the memory unit 24 is data having a bit equal to "1", then the bit is an error bit. The data register 227 is provided for temporarily storing error data in the aforementioned memory unit 24 which is not recoverable by the ECC technique. The recovery unit 225 corrects the bit data corresponding to the error bit in the data register 227 according to the information of the error bit provided by the comparison unit 223. It is noteworthy to point out that the data register 227 can be a random access memory (RAM), a non-volatile memory, a phase change memory, a free ferroelectric random access memory or a magnetic random access memory (MRAM).

The ECC unit 229 is provided for executing the data checking and correction of the aforementioned memory unit 24, and performing data checking and correction for the data stored in the data register 227. In addition to the data checking and correction for a normal read/write operation, the ECC unit 229 also executes data checking and correction for the data in the data register 227.

With reference to FIGS. 3A to 3I for the schematic views of an interactive state between memory blocks in accordance with the present invention, the flow chart of checking and correcting error bits by writing a piece of test data is illustrated.

Figure 3A:
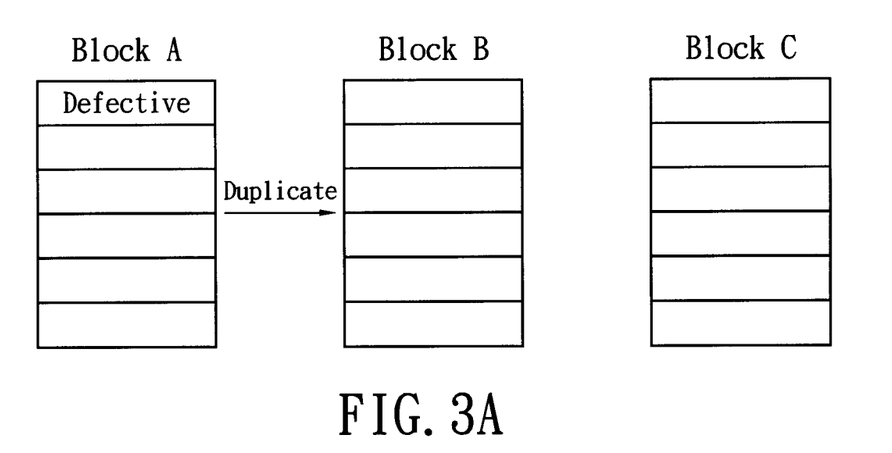
FIGS. 3A to 3I are schematic views of an interactive state between memory blocks in accordance with the present invention.

When error data is found at the beginning, three memory blocks (Block A, Block B and Block C) of the memory unit are shown in FIG. 3A. If the control unit reads data from Block A of the memory unit, and one of the memory pages (assumed that the first page is "defective" and marked in the figure) includes error data that is not recoverable by the ECC, then the control unit will duplicate the data stored in Block A into Block B, and the data in the first page marked as "defective" is not processed by the ECC, and the original data is duplicated into the first page of Block B, and then other pages are duplicated from Block A to Block B.

Figure 3B:
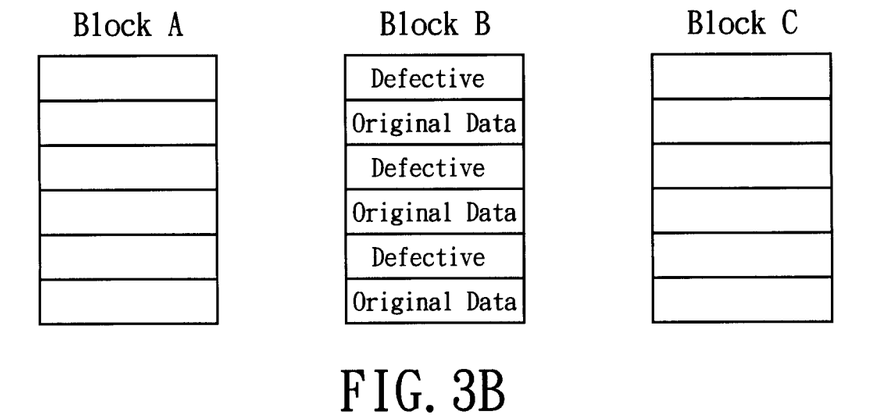

The data is duplicated and then erased. In FIG. 3B, if the error bits are found in a third page of Block A that are not recoverable by the ECC after the second page (marked as the "original data") is duplicated successfully in the aforementioned duplication process, then the data in the third page of Block A will be duplicated completely to the third page of Block B, and then the data in the fourth page will be duplicated. If the number of error bits of the data in the fifth page exceeding the range recoverable by the ECC is found after the data of the fourth page is duplicated successfully and the data of the fifth page is duplicated, then the data will be marked as "defective" and the original data in the fifth page of Block A will be duplicated to the fifth page of Block B similarly. Based on the aforementioned duplication rule, the data in Block A is duplicated into Block B, and then the data in Block A is erased.

Figure 3C:
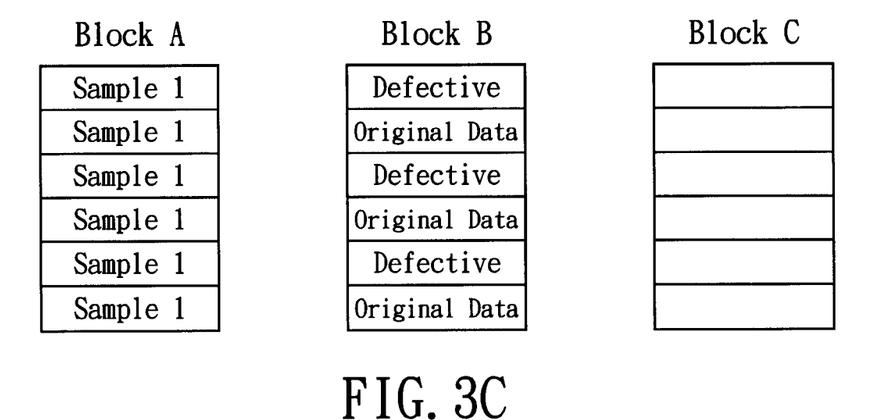

The test data is written and the error bit is checked. After the data in Block A is erased, the test data generator generates a first test data to be written into Block A as shown in FIG. 3C. After the first test data is written into each page of Block A, the data is marked as "Sample 1" of each page, and the control unit performs a reading procedure for the data in the first, third and fifth pages of Block A and compares the data with the first test data of Block A to determine whether or not there is an error bit. If an error bit in the memory page is found in the procedure, then the data in the related memory page of Block B will be duplicated into a register of the control unit, and the data will be corrected according to the error bit. After the error data is corrected, the control unit finds a block such as Block C in the flash memory, and the corrected data and other data requiring no correction are stored into Block C.

Figure 3D:
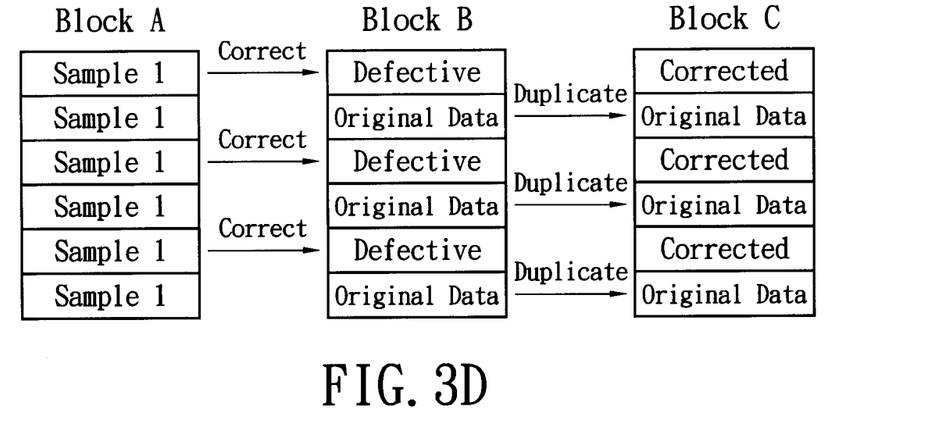

In FIG. 3D, the control unit compares the data in the first page of Block A first. The data in the first page of Block B is read and stored in the data register, and the data in the data register is corrected according to the information of the error bit, and then the correct data in the register is written into Block C and marked as "Corrected". The correct data in the second page of Block B is marked as "Original Data" and duplicated directly into Block C.

The control unit compares the data (which is error data) in the third page of Block A, and if an error bit is found, then the data in the third page of Block B will be read and stored in the data register, and the error bit will be corrected in the register. After the error bit is corrected, the corrected data is written into Block C and marked as "Corrected" in the third page.

The correct data in the fourth page of Block B is duplicated directly into Block C and marked as "Original Data". If there is an error bit found in the data in the fifth page of Block A, the data in the fifth page of Block B will be read and stored in the data register. After the error bit is corrected in the register, the corrected data is written into Block C. Based on the aforementioned correction method, the original correct data and the corrected data in Block B are written into Block C.

Figure 3E:
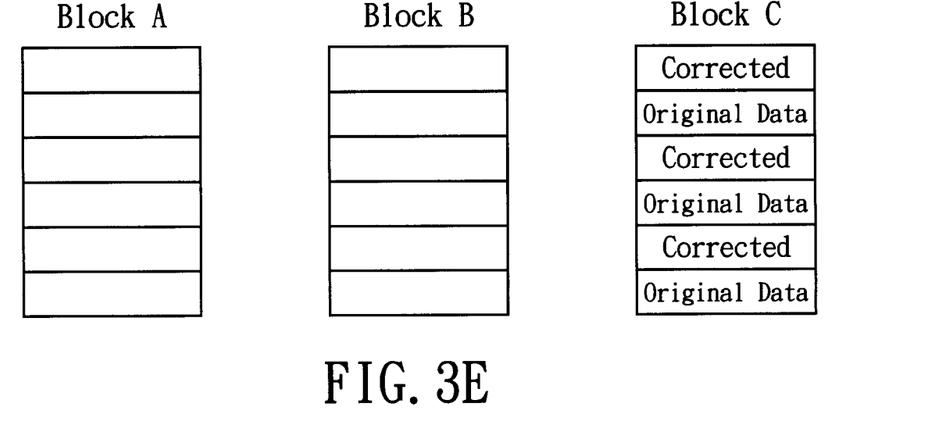

In FIG. 3E, the data in Block B is erased after the data is written into Block C, and the data in the first, third and fifth pages of Block C are corrected, and the number of error bits of each page is reduced to a range recoverable by the ECC, and the Block A is marked as bad.

However, when the first test data is written into Block A, the error bit may not be found or the error bit can be found but the corrected error bits cannot be reduced to a range recoverable by the ECC.

Figure 3F:
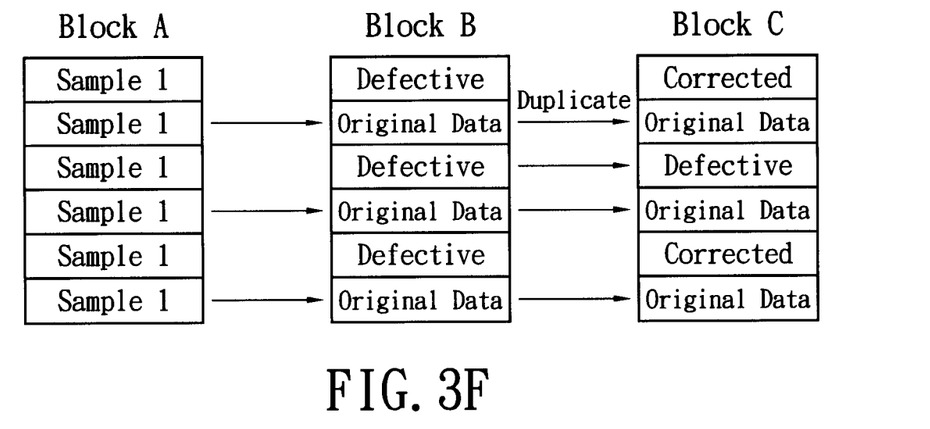

FIG. 3F shows the first test data recorded in Block A and marked as "Sample 1", and Block B records the error data marked as "Defective" and the original data marked as "Original Data". Block C records the corrected memory page (marked as "Corrected"), the original data (marked as "Original Data") and the corrected data that cannot be recovered by the ECC or error data has not found an error bit via the aforementioned procedure (marked as "Defective").

If the control unit writes the first test data into Block A, and successfully detects an error bit in the first page of Block A, and reads and corrects the data in the first page of Block B, the error bit can be reduced to a range recoverable by the ECC, and the corrected data is written into Block C. The data in the second page of Block B is duplicated into Block C.

If the first test data is used for detecting an error bit of the third page of Block, the comparison unit has not found an error bit, or has found an error bit but the number of error bits still cannot be reduced to a range recoverable by the ECC after the data is corrected data. In the former condition (wherein no error bit is found), the control unit duplicates the data in the third page of Block B into Block C; or in the later condition (wherein an error bit is found), the control unit duplicates the corrected data in the data register into Block C. If Block C is marked as a "defective" memory page, then the data in the fourth page of Block B will be duplicated into Block C.

Further, the error bit in the fifth page of Block A is detected. If the error data in the fifth page of Block B can be corrected successfully and the number of error bits is reduced to a range recoverable by the ECC, the corrected data in the data register will be written into Block C after the data in the fifth page of Block B is read into the data register and corrected. The remaining memory pages of Block B are duplicated into Block C.

Figure 3G:
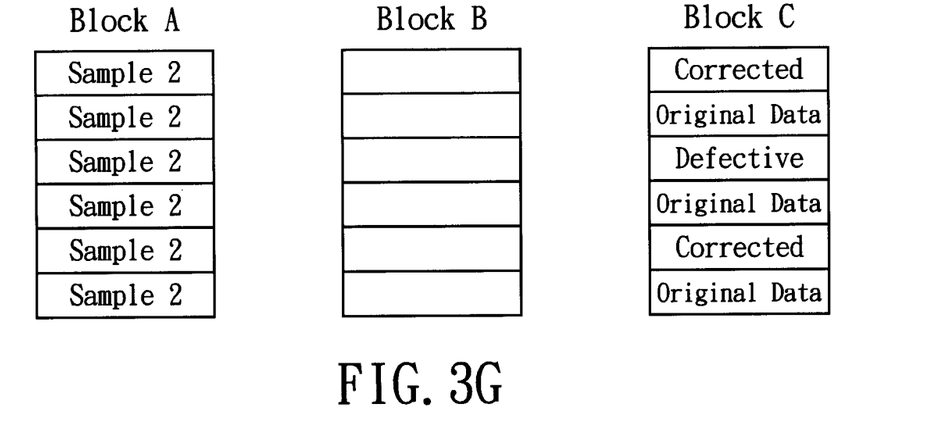
Figure 3H:
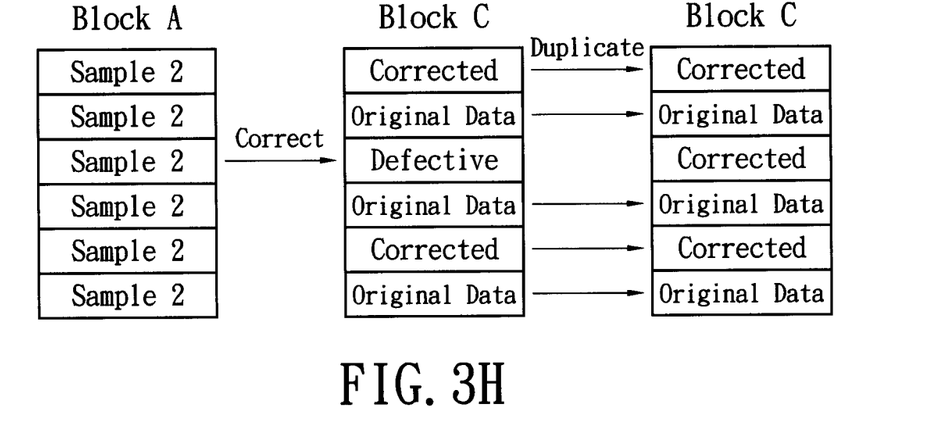
Figure 3I:
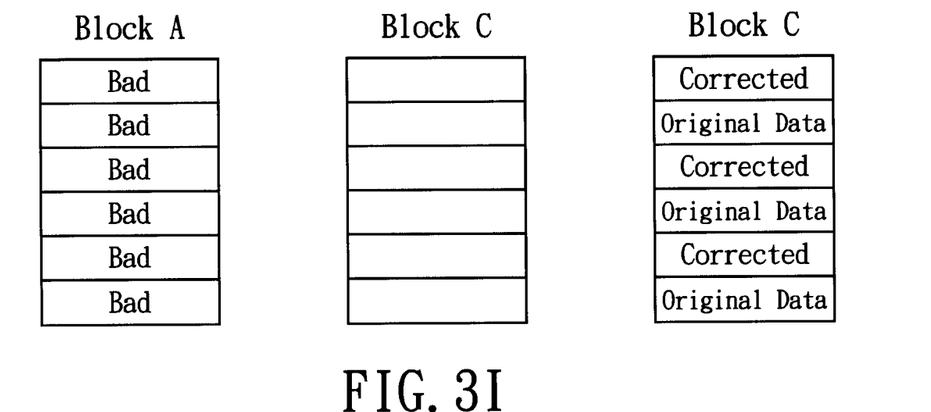

In FIG. 3F, the data in Block A and Block B are erased, after the data are written into Block C. In FIG. 3G, the test data generator generates a second test data (marked as "Sample 2") to be written into Block A to check the error bit in the third page of Block A. In FIG. 3H, the data in the first and second pages of Block C are duplicated directly into another block (Block D) of the flash memory. The control unit checks an error bit in the third page of Block A according to the second test data. If the error bit is found successfully, the data in the third page of Block C will be read into the data register, and the data in the register will be corrected according to the error bit. Assumed that the correction made at this time has reduced the number of error bits to a range recoverable by the ECC, and the corrected data in the data register is written into Block D. The remaining memory pages in Block C are duplicated into block D. Finally, Block C is erased and Block A is marked as bad after the data are written into Block D as shown in FIG. 3I.

Figure 4:
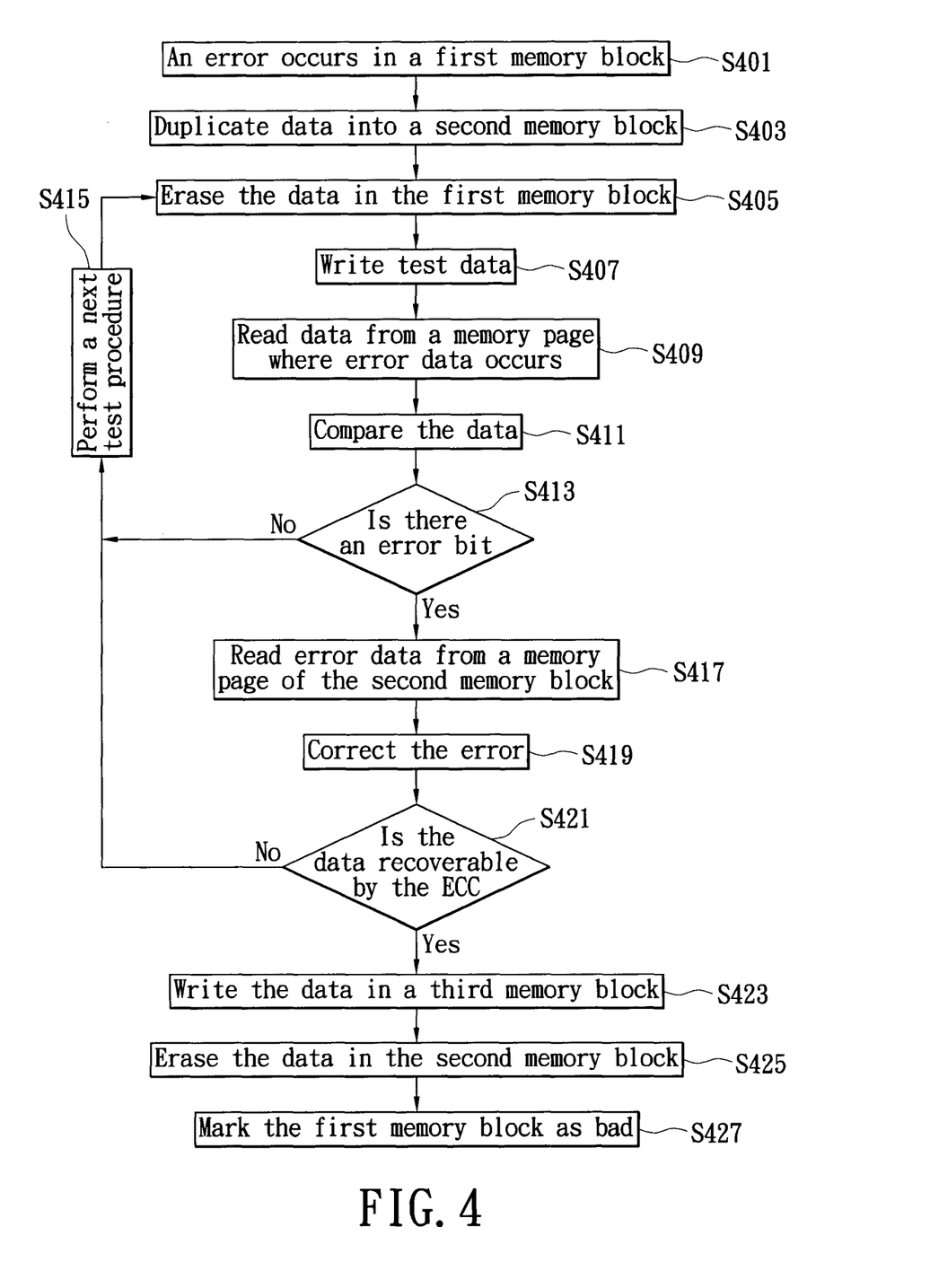
FIG. 4 is a flow chart of a data recovery process in accordance with a first preferred embodiment of the present invention.

According to the storage system architecture provided by the present invention, and the interactive condition of applying the data recovery function of each memory block, the data recovery method comprises the steps of detecting error data in the memory block that cannot be recovered by the error checking and correction (ECC) technology, and the present invention will reduce the number of error bits to a range recoverable by the ECC, and the data in the memory block is duplicated into a buffer space including another redundant memory block, or random access memory (RAM), and the data in the memory block is erased. The test procedure is used for finding the location of the error bit. The written test data and the read data are compared to obtain the location of the error bit. The data corresponding to the location of the error bit in the buffer space is corrected according to the error bit. The procedure further determines whether the error data still cannot be corrected by the ECC after the correction has been made, or one or more tests are performed to reduce the number of error bits to a range recoverable by the ECC technology to execute the error checking and correction. Finally, the memory block containing the error is marked as bad to prevent the occurrence of further errors in the future, so as to enhance the reading efficiency of the storage medium. The procedure in accordance with a preferred embodiment as shown in FIG. 4 is described as follows.

Step S401: If the control unit in the storage system reads one of the physical blocks in the memory unit (such as a flash memory), wherein error data in the first memory block, or one or more memory pages is detected, and the error data cannot be recovered by the ECC, it is necessary to duplicate the data in the original memory block into a buffer space (such as a data register of a random access memory, a non-volatile memory, a phase change memory, a free ferroelectric random access memory or a magnetic random access memory).

Step S403: The control unit uses an available block (such as the second memory block) for duplicating the data in the first memory block.

Step S405: The control unit erases the first memory block. It is noteworthy to point out that during the process of duplicating the data of the first memory block into the second memory block, the control unit controls the ECC unit to disable the error checking and recovery function for the page with error data to assure that the data transmission will not be affected by the ECC, and the data in the memory page of the first memory block will be remained unchanged and duplicated into the second memory block.

Step 407: A test procedure is executed, and a record of test data is generated by the test data generator of the control unit (wherein the first test data is written for the first time of the test procedure), and the test data is written into the first memory block where an error occurs such as the data "Sample 1" in Block A as shown in FIG. 3C.

Step S409: The control unit reads the data from the memory page where the error data occurs in the first memory block.

Step S411: The comparison unit compares the first test data provided by the test data generator with the data read from the memory page where the error occurs in the first memory block, and checks whether or not the two records of data are the same.

Step S413: The comparison result is used for determining whether or not there is an error bit (at an error hardware location). If the corresponding bits of the two records of data store different data, then the memory address of the memory page contains an error bit. If the corresponding bits of two records of data store the same data, then there is no error bit.

Step S425: The method of the invention performs a test procedure if the comparison unit has not found any error bit, and then the test data generator produces another set of different test data (referred as a second test data) for executing a second-time test procedure. Similarly, the second test data is written into the first memory block including a memory page where error data occurs for continuing the detection of an error bit in a memory page of the first memory block where error data occurs.

An upper limit of times (greater than 1) is set for the testing in the loop of the aforementioned procedure of the present invention. If no error bit is found after the upper limit of times is tested, then the control unit will report a read error message, and then the first memory block is marked as bad.

If an error bit is found after the test procedure (including Steps S405, S407, S409, S411 and S413) is carried out for a first time or several times, then the information of the error bit will be transmitted to the recovery unit.

Step S417: The control unit will duplicate the data in a memory page of the second memory block where the error data occurs into a data register.

Step S419: The recovery unit corrects the data stored in the data register and corresponding to the error bit according to the information of the error bit. For example, if the first and third bits are error bits, and the data of the memory page in the data register is 11110101, then the data in the data register will be changed from 1 to 0 or from 0 to 1, and corrected to be 01010101. After the data stored in the data register is corrected, the procedure determines whether or not the ECC unit of the control unit performs an error check and correction procedure for the data in the data register, and whether or not the number of error bits falls within a range recoverable by the ECC unit (Step S421). If the number of error bits of the data in the data register still exceeds the range recoverable by the ECC unit or the ECC unit cannot recover the detected error data in the data register, then test data generator will generate another set of test data to be written into a memory page of the first memory block where error data occurs (Step S415). The procedure continues detecting an error bit in the memory page and further corrects error data in the data register, and attempts to reduce the number of error bits to a recoverable range.

Similarly, after several records of test data are tested, and the number of tests is greater than a predetermined upper limit, the control unit will report a reading error message if the number of error bits in the data register cannot be reduced to a range recoverable by the ECC, and then the first memory block where an error occurs is marked as bad.

If the number of error bits is reduced to a range recoverable by the EEC unit after the data in the data register is corrected, or the ECC unit can correct the detected error data in the data register, then the control unit will find another available block (assumed to be a third memory block such as Block C as shown in FIG. 3E) in the memory unit, and the corrected data of the data register is written into the third memory block and at a location of the corresponding memory page where the error occurs, and the data in other memory pages of the third memory block are duplicated from the corresponding page of the second memory block with the duplicated data (Step S423). After the data in the third memory block are duplicated, the control unit will erase the second memory block (Step S425), and mark the first memory block as bad (Step S427).

The storage system of the present invention can use the aforementioned method with the procedure of writing test data into a plurality of memory pages with error data that cannot be corrected by the ECC and correcting the error data.

Figure 5:
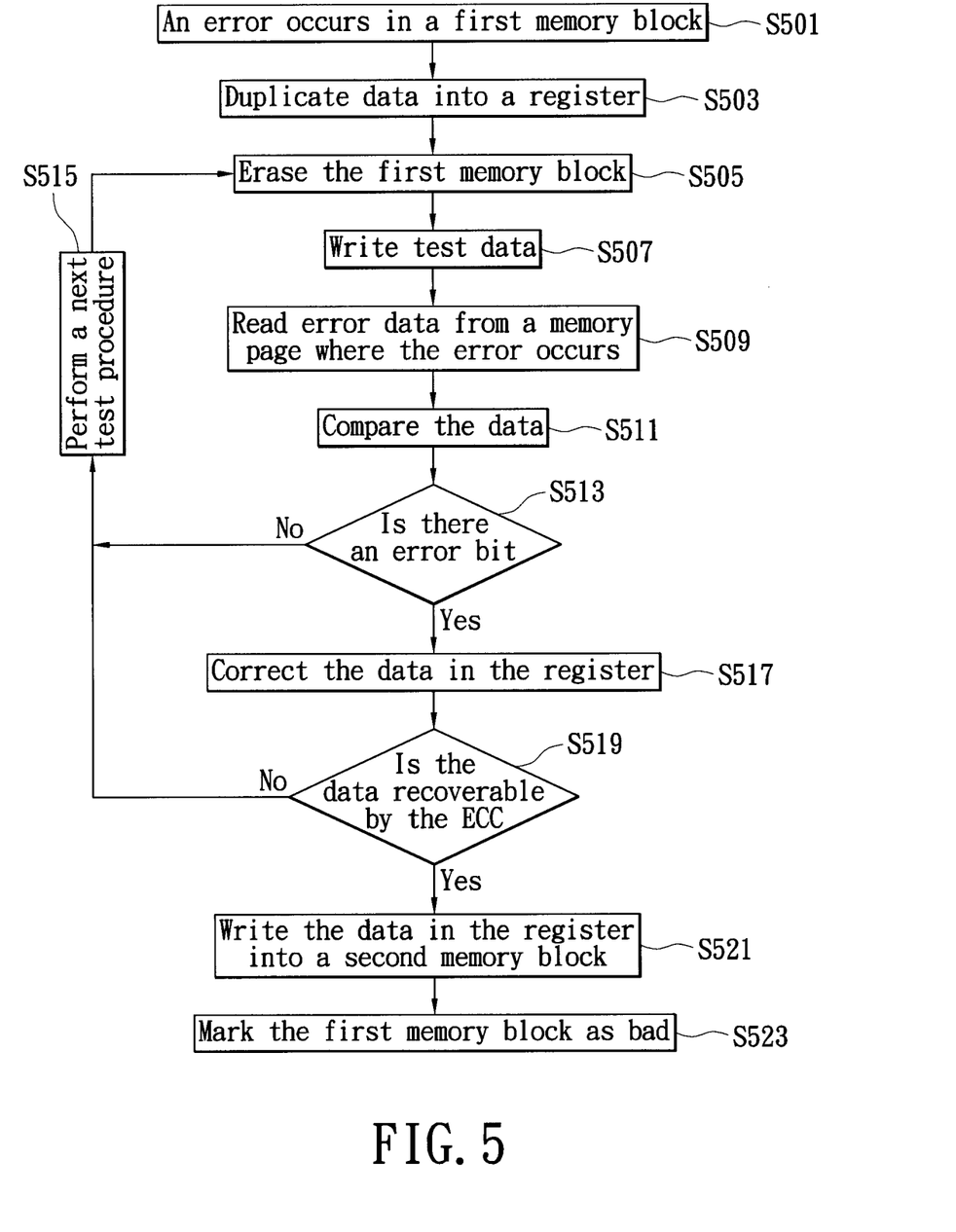
FIG. 5 is a flow chart of a data recovery process in accordance with a second preferred embodiment of the present invention.

With reference to FIG. 5 for a flow chart of a data recovery process in accordance with a second preferred embodiment of the present invention, when the control unit reads one of the physical blocks of the memory unit (such as a flash memory), and such block is assumed to be the first memory block, an error occurred in a memory page and cannot be recovered by the ECC is found in a memory page of the first memory block (Step S501). Now, it is necessary to duplicate the original data in the memory block into a buffer space. In this preferred embodiment, the control unit duplicates all data in the first memory block into a data register (Step S503) such as a memory space in the storage system or a memory of the computer system connected to the storage system, and then erases the first memory block (Step S505). In the process of duplicating data of the first memory block into the data register, the control unit controls the ECC unit to stop executing the error checking and recovery function for the memory pate with error data that cannot be corrected by the ECC to assure the data not being affected by the ECC, so that the data in the first memory block and at the memory page where the error data occurs can be remained unchanged and duplicated to the data register.

A test procedure is preformed (Step S507), and the test data generator provides a record of test data to be written into the first memory block including the memory page where the error data occurs, and then the control unit reads the data from the memory page of the first memory block where the error data occurs (Step S509) into a comparison unit for the comparison (Step S511), and the comparison unit compares the test data provided by the test data generator with the data read from the memory page of the first memory block to check whether or not the two records of the data are different (Step S513) so as to determine whether or not there is an error bit. There are two situations as described below:

Situation 1:

If different data are recorded in the bits corresponding to two records of data, then it is determined that the first memory block has an error bit. Therefore, it is necessary to correct the data recorded by the bits. In other words, the data written in the buffer area as described in Step S503 is corrected.

Situation 2:

If different data is not found in the bits corresponding to two records of data, then no error bit is found. A test procedure for the next time is preformed (Step S515), such that the test data generator generates another set of test data to be written into the first memory block until an error occurs in the memory page, and the error bit in the memory page of the first memory block is detected continuously, and such procedure includes repeating the steps S505, S507, S509, S511 and S513.

Figure 6:
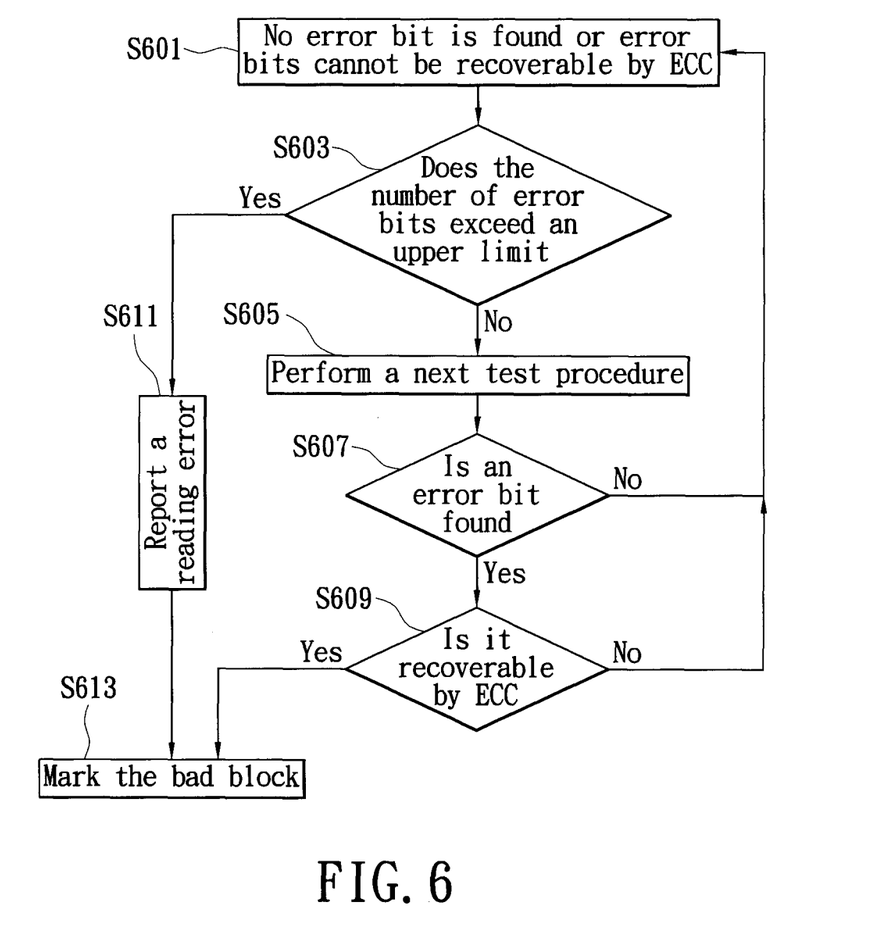
FIG. 6 is a flow chart of another testing process for recovering data in accordance with the present invention.

In Situation 2, if the number of test data provided by the test data generator exceeds a predetermined upper limit and the error bit in the memory page of the first memory block still cannot be found after the foregoing procedure has been repeated for several times, then the control unit will find an available block (which is the second memory block) in the memory unit. After the data in the block of the data register is written into the second memory block, the control unit reports a reading error message, and then marks the first memory block as bad, and the procedure is illustrated in FIG. 6.

In Situation 1, if the comparison unit finds an error bit, the information of the error bit will be sent to the recovery unit, and then the recovery unit will correct the data in the block of the data register corresponding to the error bit in the memory page according to the information of the error bit (Step S517). After the error data in the data register is corrected, the ECC unit performs an error checking and correction procedure for the data of the memory page in the block of the data register and determines whether or not the errors fall within a range recoverable by the ECC (Step S519). If the number of error bits of the error data in the memory page (which is the original memory page in the first memory block where an error occurs) of the data register still exceeds the range recoverable by the ECC unit, and then the test data generator generates another set of test data to be written into the foregoing memory page of the first memory block, and continues the foregoing checking and correction procedure as described in Step S515.

If the number of error bits in the memory page of the data register cannot be reduced to a range recoverable by the ECC effectively, after the test procedure has been taken for a predetermined number of times, then the control unit will find an available block (assumed to be the second memory block) in the memory unit. After the data in the block of the data register is written into the second memory block, the control unit reports a reading error message and marks the first memory block where error data occurs as bad), and the procedure is illustrated in FIG. 6.

If the data in the data register is corrected, and the number of error bits is reduced to a range recoverable by the ECC unit, then the control unit will find an available block (assumed to be the second memory block) in the memory unit for writing data in the data register into the block (Step S521). After the data in the second memory block are duplicated, the control unit marks the first memory block where error data occurs as bad as shown in Step S523.

If a block of the storage system has several errors in a memory page that cannot be recovered by the ECC, the storage system of the invention will duplicated all data in the block into the data register, and perform the foregoing checking and correction procedure for the memory pages in a block that cannot be corrected by the ECC one by one. If the number of error bits in each memory page of the data register that cannot be corrected by the ECC is reduced to a range recoverable by the ECC, the data stored in the buffer is written back into the memory unit, and then the ECC unit performs a correction and mark the block where the error data occurs as bad.

In Step S415 as shown in FIG. 4 and Step S515 as shown in FIG. 5, the invention performs the test procedure repeatedly under the condition that the comparison unit has not found any error bit, and the test data generator generates another set of test data for executing the test procedure for one or more times, and detecting an error bit in the memory page of the memory block where error data occurs, until an error bit is found.

When the aforementioned testing loop of the present invention is carried out, an upper limit of times (greater than 1) of tests is set for performing a next test procedure if no error bit is found or the ECC still cannot correct the error after the correction is made (Step S601). Before the next test procedure takes place, it is necessary to determine whether or not the number of tests exceeds the predetermined upper limit (Step S603). If the error bit cannot be found after this number of tests, the procedure considers that the number of tests exceeds the predetermined upper limit and then carries out Step S611, and the control unit reports a reading error result to the storage system, and marks the next tested memory block as bad (Step S613). If the number of times of taking the next test procedure is less than or equal to the predetermined upper limit, then the next test procedure will be performed (Step S605). The test procedure is illustrated in FIG. 4 or 5. The test result determines whether or not there is an error bit found (Step S607), or whether or not the ECC can correct a piece of data after the correction. (Step S609). If no error bit is found or the data recovered by the ECC still cannot be corrected, then the procedure as shown in FIG. 6 will be repeated.

In the foregoing preferred embodiment, the present invention provides a storage system with a data recovery function, wherein a built-in buffer memory is provided for exchanging data, and particularly for buffering a recovered data into the buffer memory. FIGS. 7A to 7H show the way of using a random access memory in a computer system as the memory for buffering and recovering data instead of using a memory block in a memory unit of a storage system in accordance with the present invention. Particularly, the storage system in accordance with this preferred embodiment is connected to the computer system such as a desktop computer, a notebook computer, and a portable computer system, wherein the storage capacity of the random access memory in the computer system is large enough for buffering the data of the storage system.

Figure 7A:
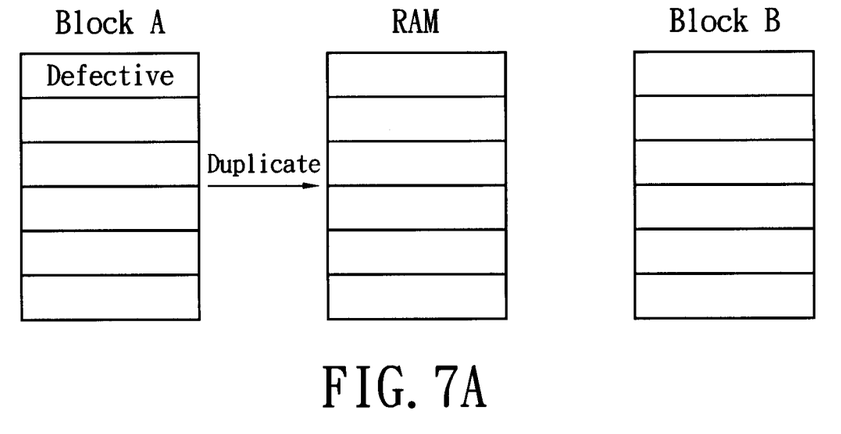
FIGS. 7A to 7H are schematic views of another interactive state between memory blocks in accordance with the present invention.
Figure 7B:
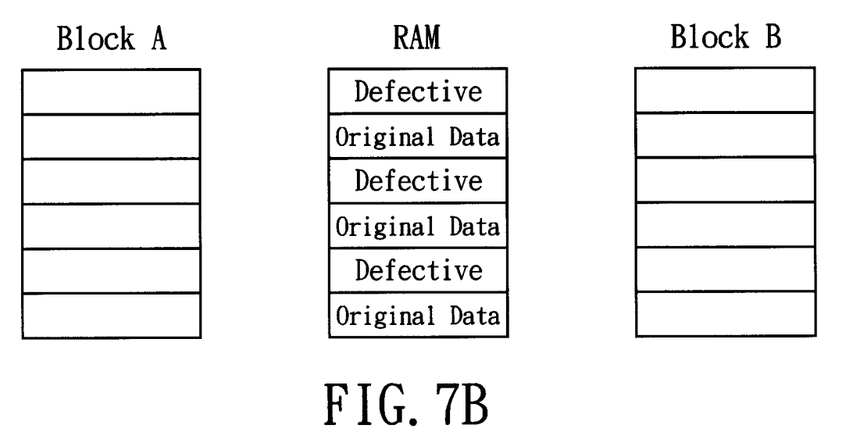
Figure 7C:
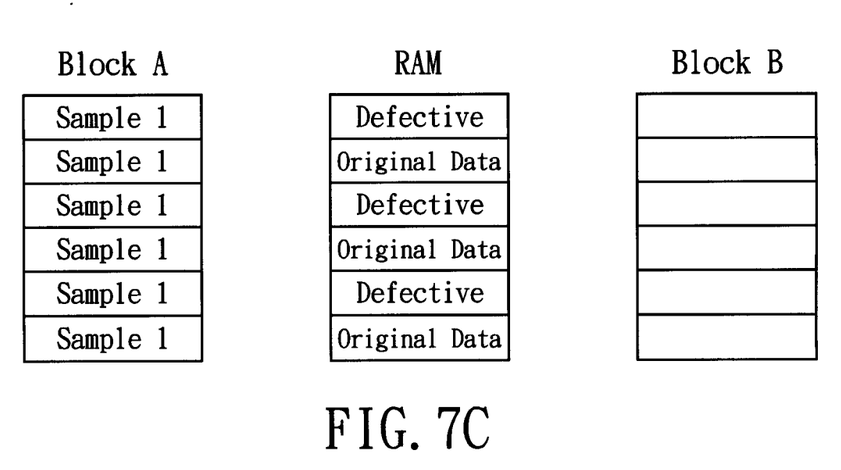

With reference to FIGS. 7A to 7C, if a piece of data is read, and a memory page (marked as a defective memory page) that cannot be recovered by the ECC such as Block A of the first page as shown in FIG. 7A occurs, then the control unit will execute duplicating the data in Block A into the data register. In this embodiment, the data of Block A is duplicated into a RAM buffer block. Assumed that the third and fifth memory pages have error data that cannot be corrected by the ECC are found, the data in the first, third and fifth pages and data in other pages free of error data that cannot be recovered by the ECC are duplicated directly into the RAM buffer block from Block A as shown in FIG. 7B.

Figure 7D:
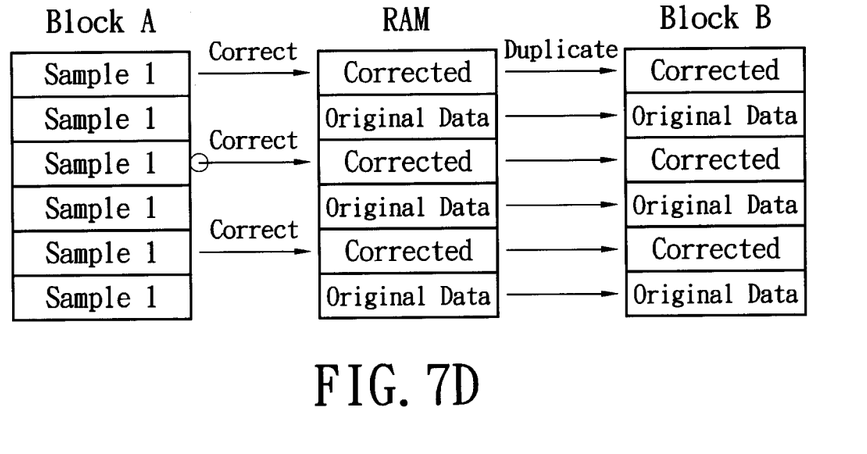

After the data is moved, the original data in Block A is erased, and the first test data is written into Block A as marked "Sample 1" in FIG. 7C. In FIG. 7D, the error bits in the first, third and fifth pages of Block A are checked according to the first test data written into each memory page. If an error bit is found, the data in the related memory pages are corrected directly in the RAM buffer block as shown in the figure. If the number of bits of the error data in the first, third and fifth pages of the data register is reduced to a range recoverable by the ECC (such as the memory page in the RAM buffer block as shown in FIG. 7D is marked as "Corrected", and the rest of memory pages are marked as "Original Data"), the control unit will find a block (assumed to be Block B) in the memory unit for duplicating the data in the RAM buffer block into Block B, and finally Block A is marked as bad.

Figure 7E:
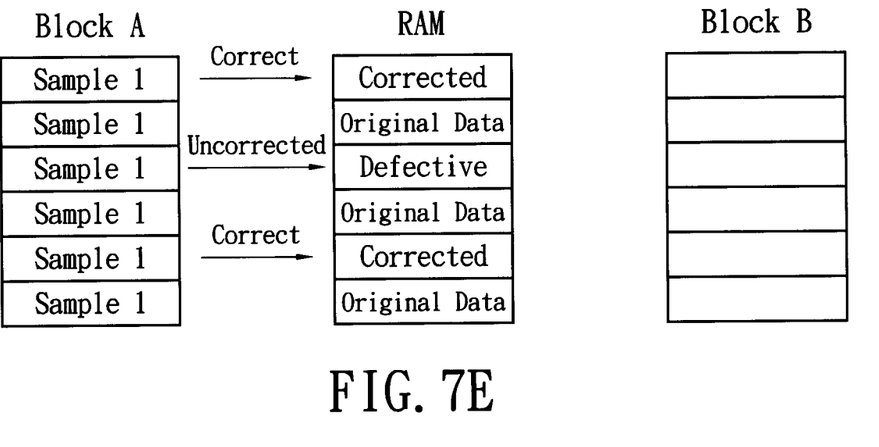

In FIG. 7E, when the control unit detects an error bit in the third page of Block A to correct the data in the third page of the data register, the following situations may occur. In Situation 1, an error bit of a piece of data marked as "Defective" in the third memory page of Block A cannot be detected by the test procedure of the first test data (such as "Sample 1"). In Situation 2, an error bit is detected, but the number of error bits of the corrected data still exceeds the range recoverable by the ECC.

If an error bit is detected as described in Situation 2, the control unit still corrects the data in the third page of the data register according to the error bit, and then reads and uses the data in the fifth page of Block A for the comparison, and corrects the error bit in the fifth page of the RAM buffer block. If an error bit cannot be detected as described in Situation 1, then the data in the third page of the RAM data block such as the memory page marked as "Defective" in the RAM buffer block as shown in FIG. 7E will not be corrected, and then the data in the fifth page of Block A is read for comparison to correct the error bit in the fifth page of the data buffer area.

Figure 7F:
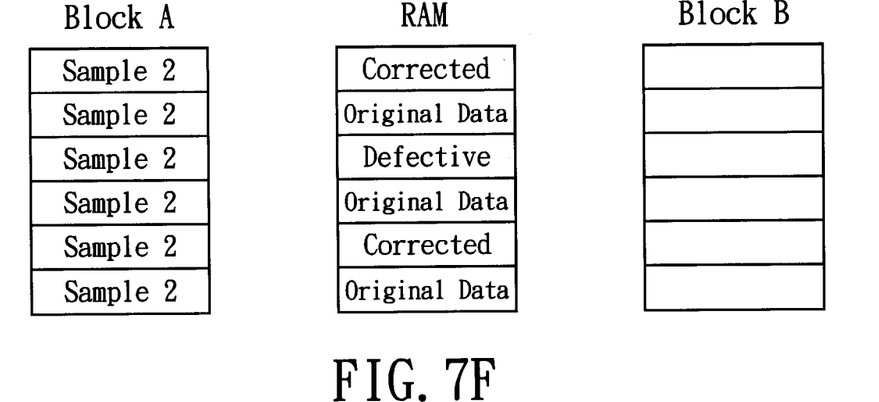
Figure 7G:
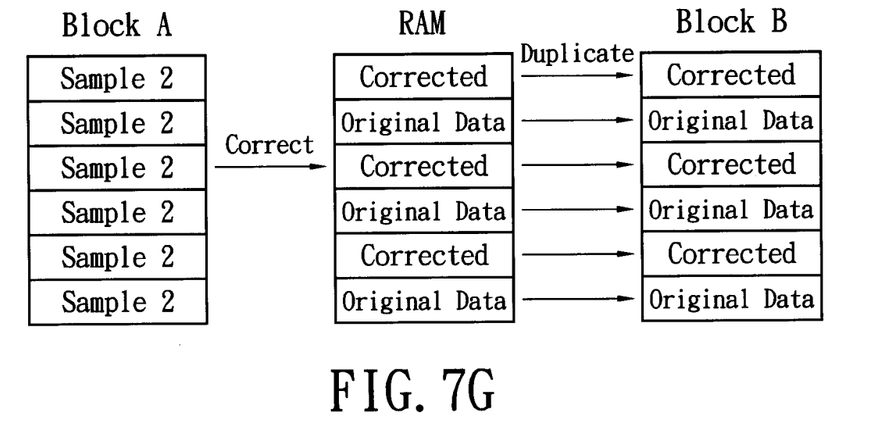
Figure 7H:
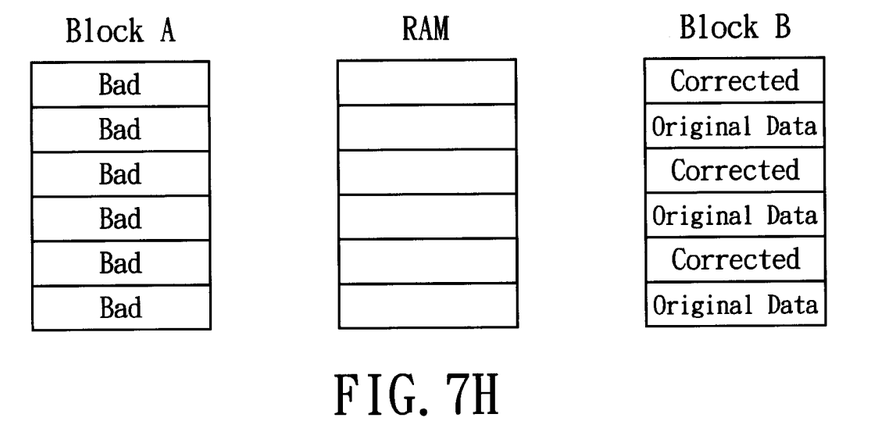

In FIG. 7F, the first, third and fifth pages of Block A have gone through testing of the first test data, and then Block A is erased and the second test data marked as "Sample 2" is written into Block A. In FIGS. 7G and 7H, after the second test data is written into Block A, the control unit reads the data from the third page of Block A and compares the data with the second test data to find the error bit, and corrects the data in the third page of the RAM buffer block such as the third memory page marked as "Corrected in the RAM buffer block as shown in FIG. 7G according to the error bit.

If the data in the third page of the data register still cannot be corrected by testing the second test data, then another set of test data is written into Block A and the aforementioned procedure is repeated to correct the data in the third page of the data register. If the number of tests for the next test exceeds a predetermined upper limit, and the number of error bits still cannot be reduced to a range recoverable by the ECC, then the control unit will output a reading error message, and store the data of the RAM buffer block into another block of the memory unit, and then Block A is marked as bad, such as a "Bad" marked in Block A as shown in FIG. 7H.

Another situation is that when the data in the first, third and fifth pages of the RAM buffer block are corrected to reduce the number of error bits of these pages to a range recoverable by the ECC, the control unit finds a Block B in the memory unit and writes the data of the data register into Block B, and then marks Block A as bad.

Therefore, the data recovery method of the present invention reduces the number of error bits of the data to a recoverable range, stores the recovered block data into another block, and marks the block with error data that cannot be corrected by the ECC as bad to prevent using the block again and enhance the reliability of data in the storage system effectively, so as to overcome the situation of an error in a block being unable to be recovered by the ECC and causing a reading error.

In summation of the description above, the present invention discloses a storage system with a data recovery function and its method that performs testing and recovery procedures for one or more times repeatedly in order to reduce errors in a storage medium to a range recoverable by an error checking and correction (ECC) function, so as to assure the accuracy of reading data and improve the data reliability effectively.

Although the present invention has been described with reference to the preferred embodiments thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A storage system with a data recovery function, comprising:
  a non-volatile memory unit; and
  a control unit electrically coupled with the non-volatile memory unit, and reading data from the non-volatile memory unit, comprising:
  a test data generator, used to generate test data and storing the test data into the non-volatile memory unit;
  means, coupled to the test data generator, for reading the stored test data from the non-volatile memory unit;
  a comparison unit, used to compare the stored test data read from the non-volatile memory unit with the generated test data to determine an address of an error bit of the non-volatile memory unit;
  an error checking and correction (ECC) unit used to perform an error checking and correction operation on data with the error bit temporarily located at the address of the error bit of the non-volatile memory unit orderly;
  a recovery unit used to correct the data with the error bit which cannot be recovered by the error checking and correction unit, temporarily stored in a data register based on the address of the error bit of the non-volatile memory unit.

2. The storage system with a data recovery function of claim 1, wherein the data register is a memory selected from the group of random access memory, non-volatile memory, phase change memory, free ferroelectric random access memory, and magnetic random access memory.

3. The storage system with a data recovery function of claim 1, wherein the test data is binary random number data.

4. A data recovery method applied in a storage system having an error checking and correction (ECC) unit, comprising:
  (a) detecting error data stored in a memory block that cannot be recovered by the ECC unit;
  (b) duplicating the unrecoverable error data, and storing the duplicated unrecoverable error data in a buffer space and erasing the unrecoverable error data in the memory block;
  (c) generating test data, and writing the test data into the memory block where the unrecoverable error data of step (a) was stored;
  (d) reading the test data from the memory block;
  (e) comparing the read test data with the generated test data so as to obtain one or more addresses having one or more error bits in the memory block where the unrecoverable error data was previously stored; and
  (f) correcting the one or more error bits of the duplicated unrecoverable error data in the buffer space based on the one or more addresses of having the one or more error bits of the memory block.

5. The data recovery method applied in a storage system of claim 4, further comprising:
  (a) after the step (f), determining whether or not error data in the duplicated unrecoverable error data in the buffer space still exists; and
    (a1) performing a test procedure for a next test, if a number of the one or more error bits of the duplicated unrecoverable error data stored in the buffer space exceeds a range recoverable by the ECC unit; or (a2) if the number of the one or more error bits of the duplicated unrecoverable error data stored in the buffer space is reduced to be within the range recoverable by the ECC unit,
 (a21) executing an error checking and correction operation; and
 (a22) marking the memory block as a bad memory block.

6. The data recovery method applied in a storage system of claim 5, further comprising a step of determining whether or not the number of times of performing the test procedure exceeds a predetermined upper limit.

7. The data recovery method applied in a storage system of claim 6, further comprising a control unit for reporting a read error message, and marking the memory block as a bad block, if the number of times of performing the test procedure exceeds the predetermined upper limit.

8. The data recovery method applied in a storage system of claim 4, wherein the buffer space is a memory selected from the group of random access memory, non-volatile memory, phase change memory, free ferroelectric random access memory, and magnetic random access memory.

9. The data recovery method applied in a storage system of claim 4, before duplicating the error data of the memory block into the buffer space further comprising disabling an error checking and recovery function of the storage system.

10. The data recovery method applied in a storage system of claim 4, wherein the test data is binary random data.

* * * * *